United States Patent
Gaggero et al.

(10) Patent No.: US 11,815,537 B2
(45) Date of Patent: Nov. 14, 2023

(54) INDUCTIVE SENSOR AND METHOD FOR THE OPERATION THEREOF

(71) Applicant: Balluff GmbH, Neuhausen a.d.F (DE)

(72) Inventors: Pascal Gaggero, Sulz (CH); Patric Eberle, Hersberg (CH)

(73) Assignee: BALLUFF GMBH, Florence, KY (US)

( * ) Notice: Subject to any disclaimer, the term of this patent is extended or adjusted under 35 U.S.C. 154(b) by 457 days.

(21) Appl. No.: 16/788,711

(22) Filed: Feb. 12, 2020

(65) Prior Publication Data

US 2020/0256907 A1 Aug. 13, 2020

(30) Foreign Application Priority Data

Feb. 13, 2019 (DE) .................. 102019103670.4

(51) Int. Cl.
*G01B 7/14* (2006.01)
*G01R 27/26* (2006.01)

(52) U.S. Cl.
CPC ........ *G01R 27/2611* (2013.01); *G01R 27/267* (2013.01)

(58) Field of Classification Search
CPC ...... G01R 27/22; G01R 27/28; G01R 27/267; G01R 27/2611; H03K 17/9535; H03K 2017/9527; G01D 5/2006; G01D 5/2046; G01D 5/2266; G01D 5/2013; G01D 5/202; G01D 5/2033; G01D 5/2073; G01D 5/12; G01D 5/20; G01D 5/22; G01D 5/249; G01D 5/2086; G01N 27/025; G01N 27/08; G01N 27/07; G01N 27/06; G01N 27/02; G01N 27/023
See application file for complete search history.

(56) References Cited

U.S. PATENT DOCUMENTS

| | | | | |
|---|---|---|---|---|
| 5,083,113 A | * | 1/1992 | Slawinski | G06K 7/086 473/589 |
| 6,175,232 B1 | * | 1/2001 | De Coulon | G01D 5/2006 324/207.12 |
| 6,448,795 B1 | * | 9/2002 | Ermakov | G01N 27/023 324/719 |
| 9,255,818 B2 | * | 2/2016 | Bergqvist | G01D 5/225 |
| 9,671,477 B2 | * | 6/2017 | Vaysse | G01D 5/204 |
| 2009/0085560 A1 | * | 4/2009 | Rollins | H03K 17/9505 324/207.16 |
| 2012/0242352 A1 | * | 9/2012 | Gong | H03K 17/9525 324/656 |
| 2012/0326711 A1 | * | 12/2012 | Roper | G01N 27/025 324/252 |
| 2016/0131503 A1 | * | 5/2016 | Goto | G01D 5/2216 324/207.17 |
| 2018/0131302 A1 | * | 5/2018 | Frampton | H02P 9/04 |
| 2018/0238714 A1 | * | 8/2018 | Leidich | G01D 5/2026 |
| 2019/0277803 A1 | * | 9/2019 | Ives | G01D 18/001 |
| 2020/0200937 A1 | * | 6/2020 | Widmer | B60L 53/124 |

* cited by examiner

*Primary Examiner* — Thang X Le
(74) *Attorney, Agent, or Firm* — Taft Stettinius & Hollister LLP; Ryan O. White; Derek B. Lavender

(57) ABSTRACT

An inductive sensor (10) has a substrate (20), on which multiple transmitter/receiver coils (31, 32, 33) are arranged side by side. It can be operated in such a way that the transmitter/receiver coils (31, 32, 33) are each stimulated independently of one another at a frequency of more than 100 MHz.

19 Claims, 4 Drawing Sheets

INDUCTIVE SENSOR AND METHOD FOR THE OPERATION THEREOF

This application is a U.S. entry of German Serial Number DE 10 2019 103 670.4 filed on Feb. 13, 2019. The disclosure of which is hereby incorporated herein in its entirety.

The present invention relates to an inductive sensor. Furthermore, it relates to a method for operating the inductive sensor.

PRIOR ART

Inductive sensors have at least one inductance in the form of an open coil. This generates a magnetic field which can be changed by means of a metallic object in proximity to the sensor. The object can be detected by measuring this change. For this purpose, the inductive sensor can either have one or more transmitter coils and one or more receiver coils or it can have a single combined transmitter/receiver coil. This has an oscillator, an evaluation unit and an output stage. As soon as a supply voltage is applied to the inductive sensor, the oscillator begins to oscillate. The resulting electromagnetic field is directed towards an active surface of the sensor. An approaching object draws energy from the oscillating circuit, whereupon its oscillatory voltage decreases. This can be detected by a downstream comparator.

If the range of an inductive sensor which uses a combined transmitter/receiver coil is to be increased, this can so far only be achieved by increasing the coil diameter and thus also the sensor diameter. If the accuracy with which a sideways movement of a detected object can be tracked is to be increased, this is at the expense of the sensor range.

It is therefore an object of the present invention to provide an inductive sensor which, when using a measuring principle with a combined transmitter/receiver coil with the same dimensions and range as a conventional sensor, has a higher accuracy in detecting lateral movements of an object. A further object of the invention is to provide a method for operating such an inductive sensor in which said sensor has a greater range than a conventional inductive sensor of the same dimensions.

DISCLOSURE OF THE INVENTION

This object is solved in one aspect of the invention by an inductive sensor which has a substrate on which several transmitter/receiver coils are arranged side by side. This means that all transmitter/receiver coils are arranged in the same plane. Preferably, two to three transmitter/receiver coils are arranged on the substrate, more preferably three transmitter/receiver coils. The invention is based on the realisation that, with a constant sensor area, several transmitter/receiver coils distributed over this area will be operated with an increased lateral sensor accuracy, which enables earlier detection of objects approaching the sensor laterally. The arrangement of the transmitter/receiver coils according to the invention also results in a lower temperature sensitivity of the sensor accuracy compared to conventional inductive sensors.

The inductive sensor is preferably set up to be operated exclusively as an inductive sensor. A device for other purposes, for example, for the galvanically isolated charging of an energy storage device, is not desirable.

Preferably, at least two of the transmitter/receiver coils are connected to a common integrated circuit (IC). This has one oscillator per transmitter/receiver coil and at least one measuring element per transmitter/receiver coil. This enables the common control of the transmitter/receiver coils for the transmission of a magnetic field as well as the common evaluation of a change of the magnetic field due to an approaching object. At least one measuring element is preferably a frequency counter.

In particular, the transmitter/receiver coils are located directly on the integrated circuit.

The integrated circuit can be connected to another computing device for signal processing, which is preferably designed as a microcontroller. This computing device can in turn be connected to a sensor backend, for example, an IO-link transceiver, a PNP bipolar transistor, an NPN bipolar transistor or a push-pull transceiver.

In a particularly space-saving embodiment of the inductive sensor, the integrated circuit is arranged on the same substrate as the one on which the transmitter/receiver coils are arranged.

In particularly safety-relevant applications of the inductive sensor, it may be necessary for it to have several redundant measuring channels if the redundancy is not to be achieved using several sensors. In this case, it can also be provided that the inductive sensor has several integrated circuits, wherein each integrated circuit is connected to only one of the transmitter/receiver coils.

In principle, each transmitter/receiver coil can have different dimensions and a different geometry. In particular, however, the transmitter/receiver coils have the same dimensions.

It is preferable that each transmitter/receiver coil has one to four windings. More preferably, each transmitter/receiver coil has one to two windings, most preferably one winding. This results in a lower temperature sensitivity of the sensor accuracy.

The substrate is preferably circular. Each transmitter/receiver coil which is circular in shape is preferably 50% or less of the diameter of the substrate. Ellipsoidal transmitter/receiver coils preferably have a minor axis, the length of which is at most 50% of the diameter of the substrate. The minor axis is that axis, the ellipse, which is orthogonal to its major axis. The major axis passes through the two focal points of the ellipse. This dimensioning advantageously enables the arrangement in the case of, for example, two or three transmitter/receiver coils on the substrate.

It is further preferable that the inductive sensor has a reference transmitter/receiver coil. A reference transmitter/receiver coil is understood to be a transmitter/receiver coil to which a reference target permanently arranged in or on the inductive sensor is assigned. The influence of the known reference target on the magnetic field of the reference transmitter/receiver coil when it is controlled can be used for referencing in order to determine what influence an object to be detected is likely to have on the magnetic field of the remaining transmitter/receiver coils. In an embodiment of the inductive sensor, one of the transmitter/receiver coils arranged side by side on the substrate functions as the reference transmitter/receiver coil. For this purpose, transmitter/receiver coils need only to be arranged on one side of the substrate. However, the reference transmitter/receiver coil is not available for the actual sensor functionality of the inductive sensor. In another embodiment of the inductive sensor, the reference transmitter/receiver coil is arranged on a side of the substrate facing away from the other transmitter/receiver coils. In yet another embodiment of the inductive sensor, the reference transmitter/receiver coil is arranged inside the substrate together with the reference target. This allows the reference transmitter/receiver coil and the reference target to be manufactured together with the substrate.

In a further aspect of the invention, this relates to a method for operating the inductive sensor. In this method, its transmitter/receiver coils are respectively stimulated independently of one another at a frequency of more than 100 MHz. Preferably, the frequency is not more than 2 GHz. This allows the inductive sensor to be operated with a high range, wherein the high frequency can be achieved in particular by using an integrated circuit. Furthermore, the high frequency leads to a lower temperature sensitivity of the sensor accuracy. In order to determine a lateral and axial position of a target, received signals from several of the transmitter/receiver coils are combined in the method to obtain a sensor range and accuracy which is superior to conventional sensors with only one transmitter/receiver coil. The determining of a lateral and axial position of the target allows it to determine its exact position in three-dimensional space. It goes beyond methods which only serve to detect the presence of a target in a measuring region without being able to determine its exact position.

The method makes it possible to determine the position of targets of any dimensions. It is not limited to cooperative targets whose shape and/or properties are known.

The combination of the received signals preferably takes place in an integrated circuit, which additionally controls the transmitter/receiver coils. For this purpose, it has in particular an oscillator.

In one embodiment of the method, the transmitter/receiver coils are simultaneously stimulated. In another embodiment of the method, the transmitter/receiver coils are stimulated one after another. In this way, either all or only some of the transmitter/receiver coils can be stimulated. The stimulation takes place in particular by means of the integrated circuit and can be programmed for signal processing by means of a computing device.

If the inductive sensor has a reference transmitter/receiver coil, this is preferably used to generate a time reference signal. If there is no reference transmitter/receiver coil, a time reference signal can be generated, for example, by means of an external crystal oscillator. The time reference signal is transferred to the integrated circuit and/or to the computing device for signal processing.

BRIEF DESCRIPTION OF THE DRAWINGS

Exemplary embodiments of the invention are depicted in the drawings and are explained in more detail in the following description.

EXEMPLARY EMBODIMENTS OF THE INVENTION

Figure 1:
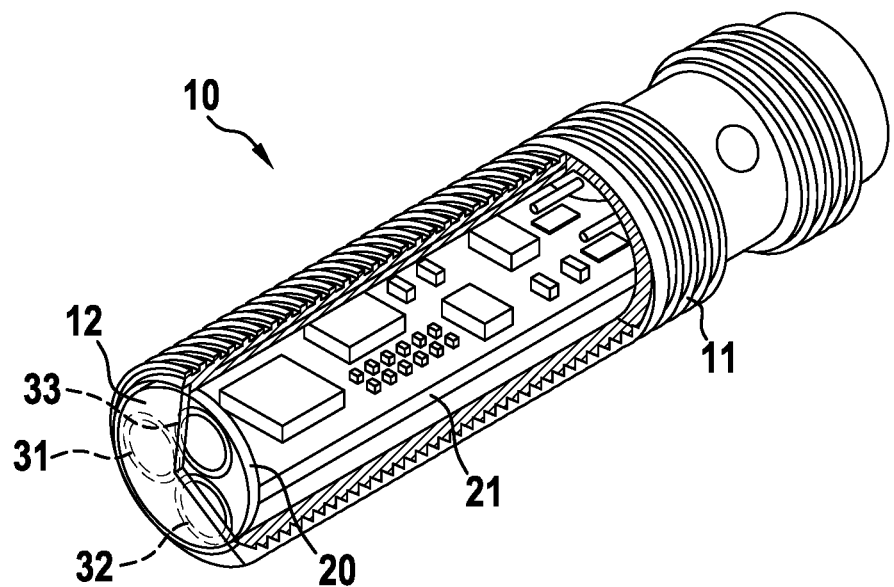
FIG. 1 shows a partially cut isometric depiction of an inductive sensor according to an exemplary embodiment of the invention.
Figure 2:
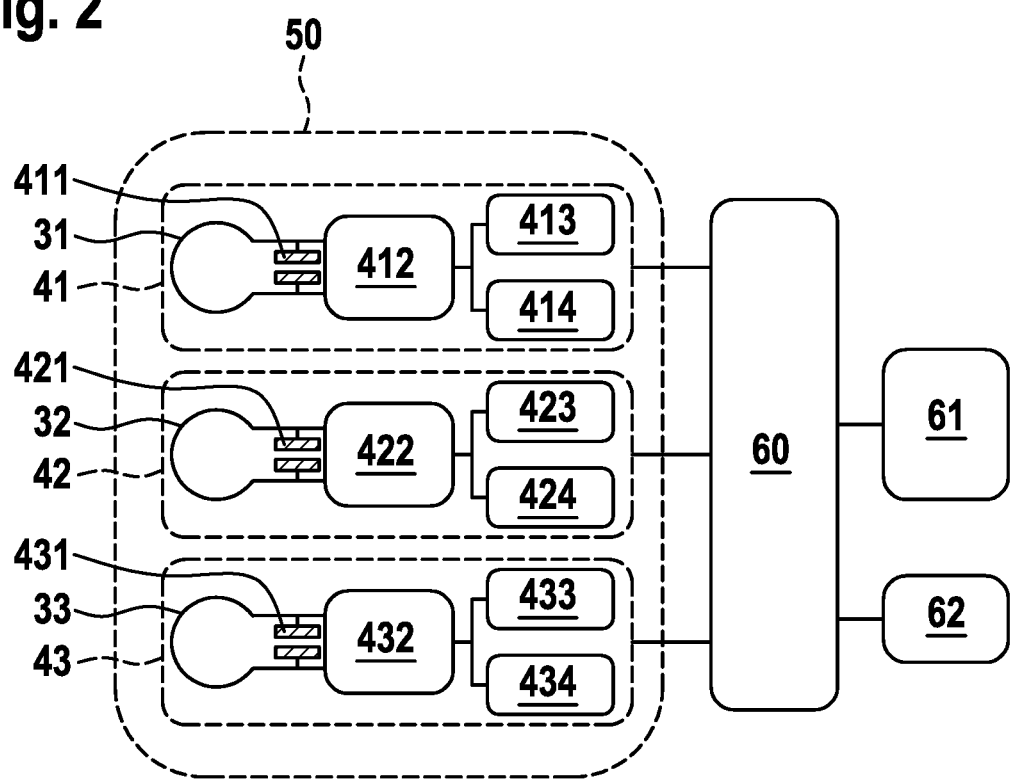
FIG. 2 shows a schematic depiction of important components of an inductive sensor according to an exemplary embodiment of the invention.

An inductive sensor 10 according to a first exemplary embodiment of the invention has a housing 11, which consists of a metal. The housing 11 is substantially circular-cylindrical and has an opening on its front side which is closed by a plastic disc 12. Within the housing 11, a circular substrate 20 in the form of a printed circuit board is arranged directly behind the plastic disc 12. A further printed circuit board 21 is connected to the substrate 20 and extends along the longitudinal axis of the housing 11. It carries various electronic components of the inductive sensor 10. On the side of the substrate 20 facing the plastic disc 12, three circular transmitter/receiver coils 31, 32, 33 are arranged, which are designed as open coils and each have one winding.

Each of the transmitter/receiver coils 31, 32, 33 forms part of a measuring channel 41, 42, 43. In each of the measuring channels 41, 42, 43, the respective transmitter/receiver coil 31, 32, 33 is connected in parallel to a capacitor 411, 421, 431 and connected to an oscillator 412, 422, 432. Each oscillator 412, 422, 432 is connected to two measuring elements, namely to a measuring element 413, 423, 433 for measuring a frequency and a measuring element 414, 424, 434 for measuring an amplitude. The measuring elements 413, 423, 433 for measuring the frequency are designed as frequency counters. The capacitors 411, 421, 431, the oscillators 412, 422, 432 and the measuring elements 413, 414, 423, 424, 433, 434 are arranged in an integrated circuit 50. This circuit is located on the side of the substrate 20 opposite the transmitter/receiver coils 31, 32, 33. It is connected to a computing device 60 in the form of a microcontroller, which is arranged on the other circuit board 21. The computing device 60 has an integrated temperature sensor 61. An IO-link transceiver 62 serves as a sensor backend for the transmission of measurement data from the inductive sensor 10.

To measure the axial and lateral position of an object, two of the transmitter/receiver coils 31, 32 are stimulated by their oscillators 412, 422. A change in the frequency and amplitude of their magnetic fields is detected in their measuring elements 413, 414, 423, 424 and is first passed on to the integrated circuit 50 and then to the computing device 60. In this way, the transmitter/receiver coils 31, 32 are excited simultaneously or consecutively. The third transmitter/receiver coil 33 functions as a reference transmitter/receiver coil. For this purpose, it has a reference target which is not shown. A time reference signal is generated in the integrated circuit 50 by means of the reference transmitter/receiver coil 33. The measured frequency and amplitude values are calculated with the time reference signal and passed on to the calculator 60. Taking into account the data from the temperature sensor 61, the axial and lateral position of the object is calculated there.

Figure 3A:
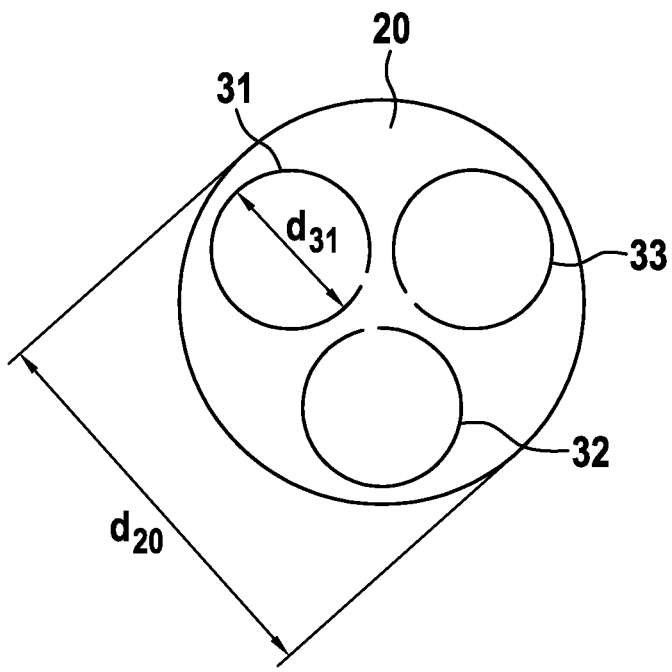
FIGS. 3a to 3c show arrangements of reference transmitter/receiver coils on a circular substrate in different exemplary embodiments of the inductive sensor according to the invention.
Figure 3B:
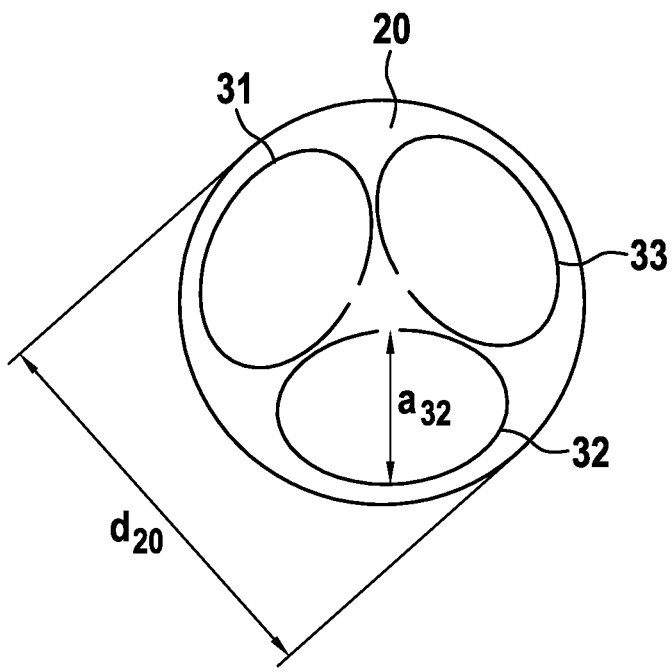
Figure 3C:
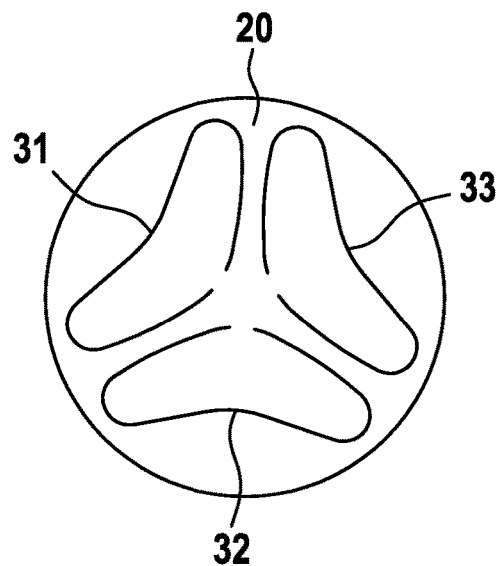

FIG. 3a shows that the diameter $d_{31}$ of the first coil 31, which also corresponds to the diameters of the other two equally sized transmitter/receiver coils 32, 33, is less than 45% of the diameter $d_{20}$ of the substrate 20. In a second exemplary embodiment of the inductive sensor, however, the transmitter/receiver coils 31, 32, 33 are not circular but instead ellipsoidal, as shown in FIG. 3b. Each of the transmitter/receiver coils 31, 32, 33, which in turn are of the same size, has a minor axis $a_{32}$ whose length is less than 45% of the diameter $d_{20}$ of substrate 20. In a third exemplary embodiment of the inductive sensor, the three transmitter/receiver coils 31, 32, 33, as depicted in FIG. 3c, each have a boomerang shape.

Figure 4:
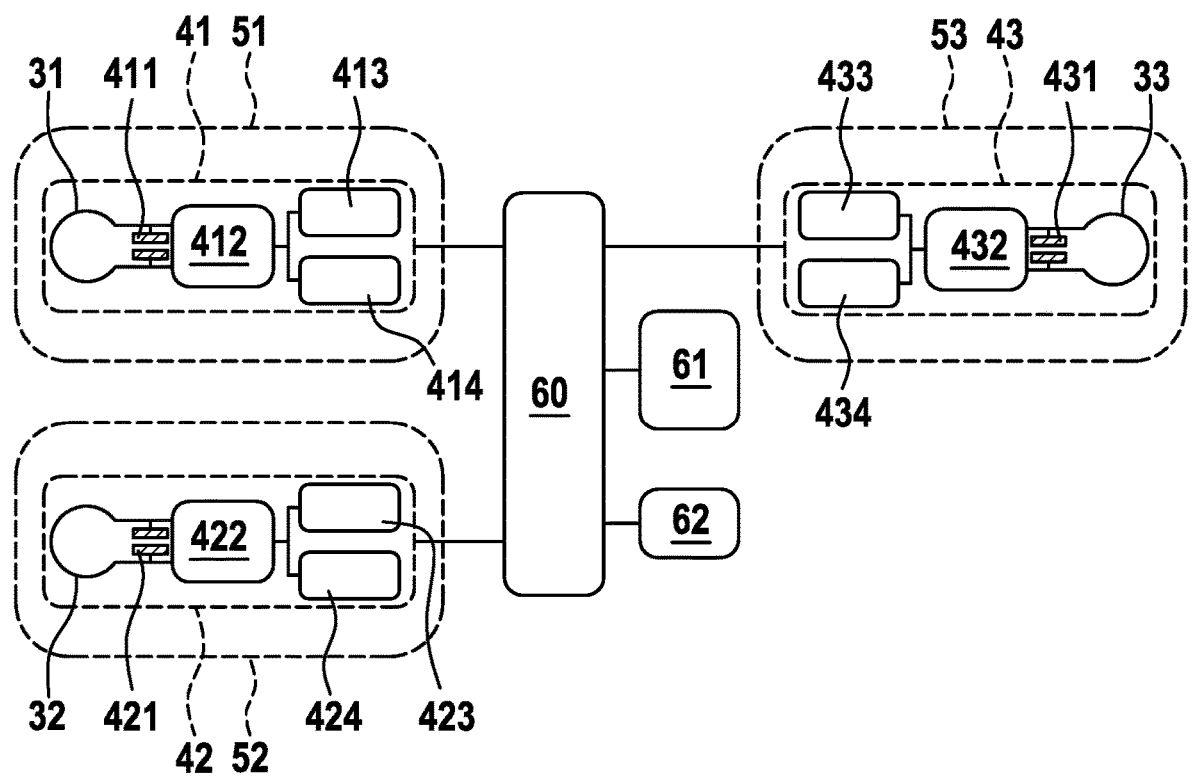
FIG. 4 shows important components of an inductive sensor according to another exemplary embodiment of the invention.

FIG. 4 shows a fourth exemplary embodiment of the design sensor 10. In this exemplary embodiment, only two of the transmitter/receiver coils 31, 32 are arranged on the side of the substrate 20 facing the plastic disc 12. The third transmitter/receiver coil 33 is arranged together with a reference target inside the substrate 20, which is designed for this purpose as a multilayer printed circuit board. The third transmitter/receiver coil 33 can therefore function again as a reference transmitter/receiver coil. In contrast to the previous exemplary embodiments, each of the measuring channels 41, 42, 43 has its own integrated circuit 51, 52, 53. Otherwise, the structure of this exemplary embodiment of the inductive sensor corresponds to the first exemplary embodiment. The inductive sensor 10 according to the fourth exemplary embodiment enables a redundant measurement by means of its first measuring channel 41 and its second measuring channel 42. This makes is suitable for use in safety-relevant environments.

Figure 5A:
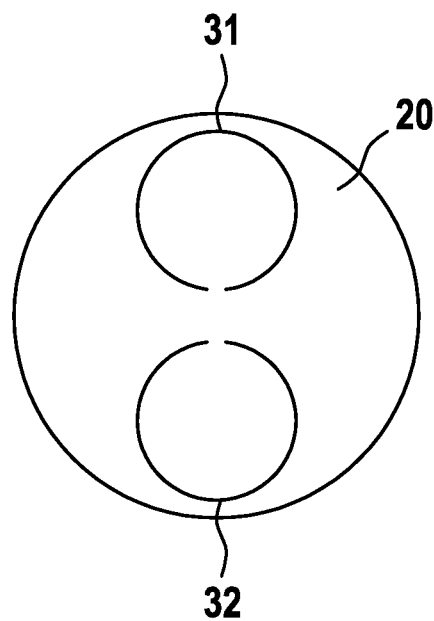
FIGS. 5a to 5b show the arrangement of transmitter/receiver coils on a circular substrate in other exemplary embodiments according to the invention.
Figure 5B:
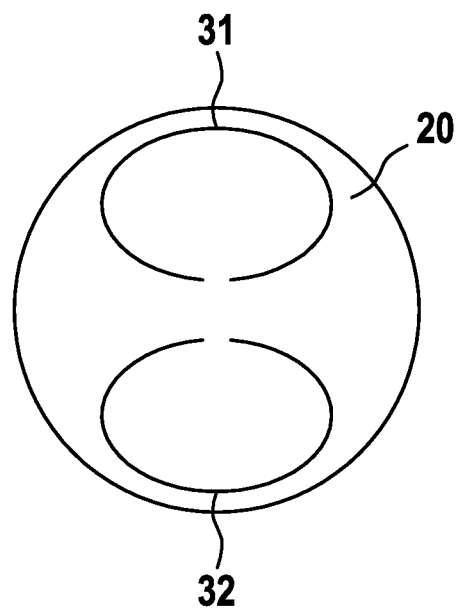

As depicted in FIG. 5a, the two transmitter/receiver coils 31, 32 in the fourth exemplary embodiment each have a circular shape. In a fifth exemplary embodiment, which is depicted in FIG. 5b, they are each ellipsoidal. In these two exemplary embodiments, the diameter and the length of the minor axis of each of the transmitter/receiver coils 31, 32 are also less than 45% of the diameter of the substrate 20.

The invention claimed is:

1. An inductive sensor, comprising:
   a substrate on which multiple transmitter and receiver coils are arranged side by side;
   a printed circuit board connected to the substrate;
   multiple measuring elements coupled to the multiple transmitter and receiver coils for measuring frequency and amplitude values:
   a computing device that is a microcontroller arranged on the circuit board; and
   a temperature sensor integrated into the computing device;
   wherein each transmitter and receiver coil has 1 to 4 windings;
   wherein, measured frequency and amplitude values are calculated taking into account data from the temperature sensor.

2. The inductive sensor according to claim 1, wherein at least two of the transmitter and receiver coils are connected to a common integrated circuit which has one oscillator per transmitter and receiver coil and at least one measuring element per transmitter and receiver coil.

3. The inductive sensor according to claim 2, further wherein the integrated circuit is arranged on the substrate.

4. The inductive sensor according to claim 3, further wherein the transmitter and receiver coils are arranged on the integrated circuit.

5. The inductive sensor according to claim 1, further wherein the transmitter and receiver coils have the same dimensions.

6. The inductive sensor according to claim 1, further wherein each transmitter and receiver coil has 1 to 2 windings.

7. The inductive sensor according to claim 1, further wherein the substrate is circular and each transmitter and receiver coil has a diameter or a minor axis of at most 50% of the diameter of the substrate.

8. The inductive sensor according to claim 1, further comprising a reference transmitter and receiver coil.

9. The inductive sensor according to claim 8, further wherein the reference transmitter and receiver coil is one of the transmitter and receiver coils arranged side by side on the substrate.

10. The inductive sensor according to claim 8, further wherein the reference transmitter and receiver coil is arranged together with a reference target on a side of the substrate opposite the multiple transmitter and receiver coils.

11. The inductive sensor according to claim 1, further wherein the transmitter and receiver coils are each stimulated independently of one another at a frequency of more than 100 MHz.

12. The inductive sensor according to claim 11, further wherein reception signals of several of the transmitter and receiver coils are combined to determine a lateral and axial position of a target.

13. The inductive sensor according to claim 12, further wherein the combining of the reception signals takes place in an integrated circuit which controls the transmitter and receiver coils.

14. The inductive sensor according to claim 11, further wherein the transmitter and receiver coils are stimulated simultaneously.

15. The inductive sensor according to claim 11, further wherein the transmitter and receiver coils are stimulated in succession.

16. The inductive sensor according to claim 11, further wherein a time reference signal is generated by a reference transmitter and receiver coil.

17. The inductive sensor according to claim 6, further wherein all transmitter and receiver coils are arranged in the same plane.

18. The inductive sensor according to claim 1, further comprising a circuit located on the opposite side of the substrate as the multiple transmitter and receiver coils, the circuit comprising capacitors, oscillators, and measuring elements.

19. The inductive sensor according to claim 1, further comprising a third transmitter and receiver coil and a reference target both arranged inside the substrate.

* * * * *